United States Patent
Zhao et al.

(10) Patent No.: US 9,846,460 B2
(45) Date of Patent: Dec. 19, 2017

(54) SERVER SYSTEM AND LIMITING MECHANISM USED THEREBY

(71) Applicants: INVENTEC TECHNOLOGY CO., LTD, Shanghai (CN); INVENTEC CORPORATION, Taibei (TW)

(72) Inventors: Chengwang Zhao, Shanghai (CN); Bingwei Peng, Shanghai (CN); Zhifeng Zhu, Shanghai (CN)

(73) Assignees: INVENTEC TECHNOLOGY CO., LTD, Shanghai (CN); INVENTEC CORPORATION, Taibei (TW)

( * ) Notice: Subject to any disclaimer, the term of this patent is extended or adjusted under 35 U.S.C. 154(b) by 0 days.

(21) Appl. No.: 15/366,572

(22) Filed: Dec. 1, 2016

(65) Prior Publication Data

US 2017/0177040 A1    Jun. 22, 2017

(30) Foreign Application Priority Data

Dec. 17, 2015   (CN) .......................... 2015 1 09560164

(51) Int. Cl.
*G06F 1/18*   (2006.01)
*H05K 7/14*   (2006.01)

(52) U.S. Cl.
CPC ........... *G06F 1/187* (2013.01); *H05K 7/1489* (2013.01)

(58) Field of Classification Search
None
See application file for complete search history.

(56) References Cited

U.S. PATENT DOCUMENTS

| | | | | |
|---|---|---|---|---|
| 7,712,615 B2* | 5/2010 | Chen | ..................... | H01R 9/2416 174/69 |
| 8,146,756 B2* | 4/2012 | Brock | ..................... | A47B 96/06 211/192 |
| 8,251,333 B1* | 8/2012 | Zhang | ..................... | A47B 91/00 248/222.11 |
| 9,004,432 B2* | 4/2015 | Lacarra | .................. | A47B 88/43 211/26 |
| 9,198,323 B1* | 11/2015 | Chen | ........................ | F16C 29/04 |
| 9,609,783 B2* | 3/2017 | Nishiyama | ........... | H05K 7/1489 |
| 2003/0141791 A1* | 7/2003 | Dubon | ................. | H05K 7/1489 312/333 |
| 2005/0052102 A1* | 3/2005 | Lauchner | ............... | A47B 88/43 312/334.5 |
| 2009/0310894 A1* | 12/2009 | Yu | .......................... | A47B 88/40 384/21 |
| 2012/0061551 A1* | 3/2012 | Zhang | ................... | H05K 7/1489 248/560 |
| 2012/0145874 A1* | 6/2012 | Eberle, Jr. | ............ | H05K 7/1489 248/636 |

(Continued)

*Primary Examiner* — Xanthia C Cunningham
(74) *Attorney, Agent, or Firm* — Oliff PLC

(57) ABSTRACT

The present invention provides a server system and a limiting mechanism used thereby. Through mutual cooperation between the limiting mechanism which sets on a server rack and sliding grooves and limiting holes which are formed in outer side walls of a server case, when internal components of the server case are drawn out, a rear end of the server case can be effectively prevented from turning up or falling down, the problem of case fixation when the server rack uses a tray type sliding rail is solved, the structure is simple and reliable and the practicability is very high.

10 Claims, 3 Drawing Sheets

(56) References Cited

U.S. PATENT DOCUMENTS

| | | | | |
|---|---|---|---|---|
| 2012/0163740 A1* | 6/2012 | Yu | H05K 7/1489 | 384/21 |
| 2012/0170877 A1* | 7/2012 | Yu | H05K 7/1489 | 384/21 |
| 2013/0058033 A1* | 3/2013 | Hu | G11B 33/124 | 361/679.33 |
| 2013/0259411 A1* | 10/2013 | Judge | F16C 29/04 | 384/49 |
| 2014/0055959 A1* | 2/2014 | Manda | G11B 33/128 | 361/728 |
| 2014/0226924 A1* | 8/2014 | Judge | H05K 7/1489 | 384/41 |
| 2014/0265784 A1* | 9/2014 | Russell | H05K 7/1421 | 312/333 |
| 2014/0340837 A1* | 11/2014 | Jau | G06F 1/16 | 361/679.33 |
| 2015/0049429 A1* | 2/2015 | Zhu | G06F 1/187 | 361/679.39 |
| 2015/0062801 A1* | 3/2015 | Zhang | G06F 1/187 | 361/679.38 |
| 2015/0077924 A1* | 3/2015 | Rauline | H05K 7/1489 | 361/679.39 |
| 2015/0092340 A1* | 4/2015 | Jau | G11B 33/128 | 361/679.39 |
| 2015/0181753 A1* | 6/2015 | Murakami | H05K 7/1489 | 211/26 |
| 2015/0208802 A1* | 7/2015 | Yoneda | A47B 88/04 | 312/333 |
| 2015/0334868 A1* | 11/2015 | Fricker | H05K 7/1489 | 361/727 |
| 2016/0135325 A1* | 5/2016 | Chen | A47B 96/067 | 312/334.1 |
| 2016/0157377 A1* | 6/2016 | Nishiyama | H05K 7/1489 | 361/679.58 |
| 2016/0262538 A1* | 9/2016 | Chen | H05K 7/1489 | |
| 2016/0278234 A1* | 9/2016 | Chen | H05K 7/1489 | |
| 2016/0286683 A1* | 9/2016 | Chen | H05K 7/1489 | |
| 2016/0369844 A1* | 12/2016 | Ito | H05K 7/1489 | |
| 2017/0020024 A1* | 1/2017 | Chen | H05K 7/1489 | |
| 2017/0090528 A1* | 3/2017 | Chen | G06F 1/187 | |

* cited by examiner

US 9,846,460 B2

SERVER SYSTEM AND LIMITING MECHANISM USED THEREBY

BACKGROUND OF THE PRESENT INVENTION

Field of Invention

The present invention relates to the field of servers, in particular to a server system and a limiting mechanism used thereby.

Description of Related Arts

With respect to the existing server, in order to facilitate the maintenance of a server case, the server case is placed on sliding rails of a server rack to draw the server case out of the server rack at any time. However, the sliding rails of the server rack usually play a role of bearing loads and cannot prevent the case from moving in an upward direction. When the case is placed on the sliding rails, the rear half portion of the case is in a non-fixed state. In addition, the internal structures of partial servers can be drawn out. When the server is in a state that the internal structure is drawn out, since a great amount of hard disk modules are mounted at the front portion of the server case, the weight of the front portion of the server case is heavier, the situation of overall imbalance is caused and the rear portion thereof has a trend of uplifting. If a downward force is slightly applied to the drawn-out modules at this moment, the case is possibly caused to be turned over. If a machine exists above the case at this moment, collision will be caused. Both these two situations may cause injuries to users and damages to the machine.

SUMMARY the present invention provides a limiting mechanism, which is applied to a server system, wherein the server system has a server rack and a server case, the server rack comprises sliding rails, the sliding rails are oppositely arranged on two sides of the server rack, and the server case is slidably arranged on the sliding rails; and wherein the mechanism comprises limiting piece, slidably setting on the sliding rails, equipped with a convex part on a side surface of the limiting piece towards the server case, equipped with a first barrier portion on a side of the limiting piece towards a rear end of the sliding rail to limit the limiting piece sliding out of the sliding rail; sliding groove formed in outer side wall of the server case and located at rear end of the outer side wall of the server case, one end of the sliding groove connecting to rear end surfaces of the outer side wall of the server case for sliding the convex part into the sliding groove; and limiting hole formed in the outer side walls of the server case and located at the other ends of the sliding grooves, the shape of the limiting holes matching with the shape of the convex part, to allow the convex parts to be buckled in the limiting holes, wherein when the server case is mounted on the server rack along the sliding rails, the limiting pieces are driven to relatively slide on the sliding rails, and the convex parts slide along the sliding grooves and are clamped in the limiting holes to realize limitation in a vertical direction to limit the movement of the server case in the vertical direction.

DESCRIPTION OF COMPONENT MARK NUMBERS

Figure 1:
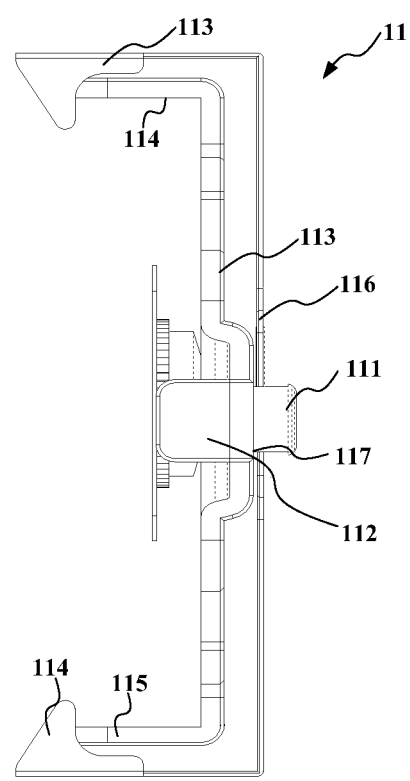
FIG. 1 illustrates a side view of a limiting piece of the present invention in one specific embodiment.

1 Limiting mechanism
11 Limiting piece
111 Convex part
112 Barrier portion
113 Limiting part
114 Elastic clamping hook
115 Supporting portion
116 Connecting portion
117 Fixing hole
12 Sliding groove
121 Notch
122 Notch
13 Limiting hole
2 Server rack
21 Sliding rail
3 Sever
31 Server case
311 Outer side wall
32 Second hard disk component

DETAILED DESCRIPTION

The implementation mode of the present invention will be described below through specific embodiments. One skilled in the art can easily understand other advantages and effects of the present invention according to contents disclosed by the description. The present invention can also be implemented or applied through other different specific implementation modes. Various modifications or changes can also be made to all details in the description based on different points of view and applications without departing from the spirit of the present invention. It needs to be stated that the following embodiments and the features in the embodiments can be combined with one another under the situation of no conflict.

It needs to be stated that the drawings provided in the following embodiments are just used for schematically describing the basic concept of the present invention, thus only illustrate components only related to the present invention and are not drawn according to the numbers, shapes and sizes of components during actual implementation, the configuration, number and scale of each component during actual implementation thereof may be freely changed, and the component layout configuration thereof may be more complex.

In a large-size server system, a plurality of servers can be arranged on a server rack in a cascade manner through sliding rails. In addition, the internal components of partial servers (such as hard disk components of storage servers) can be drawn out and consequently the weight of one end of the server is caused to be obviously higher than the weight of the other end. However, the sliding rails of the existing rack basically only play a role of supporting and bearing the server. As a result, when the stress of the two ends of the server is caused to be seriously imbalanced due to drawing of the internal components, the rear end of the server easily turns up, possibly strikes the server in an adjacent upper layer and thereby causes the server to be damaged, or slides out of the rack, causes the server to be damaged and influence the personnel safety of working personnel. Therefore, the server which is arranged on the server rack needs to be flexibly fixed to prevent the above-mentioned adverse situations from occurring. By arranging a limiting mechanism in the server system, the present invention can better solve the above-mentioned problems.

Figure 2:
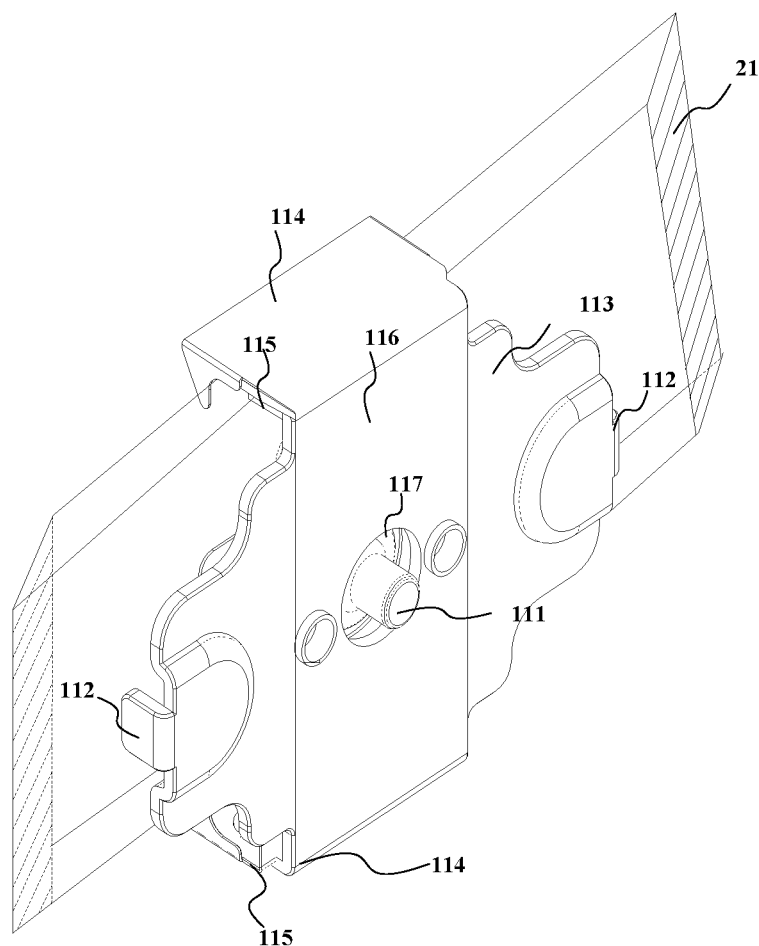
FIG. 2 illustrates a schematic application view of a limiting piece of the present invention in one specific embodiment.
Figure 3:
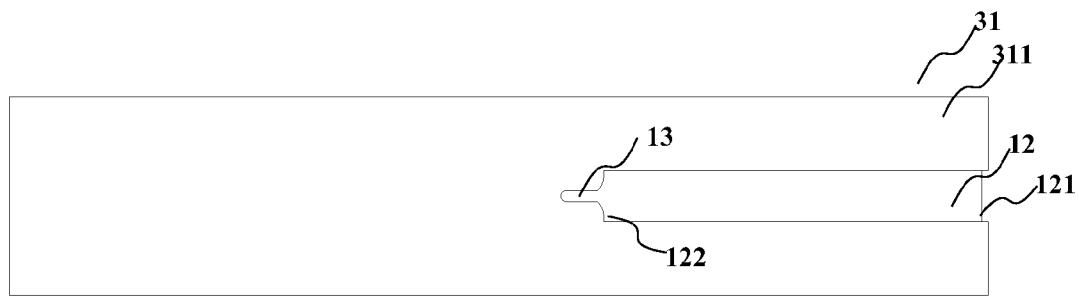
FIG. 3 illustrates a side view of a server case of the present invention in one specific embodiment.
Figure 4:
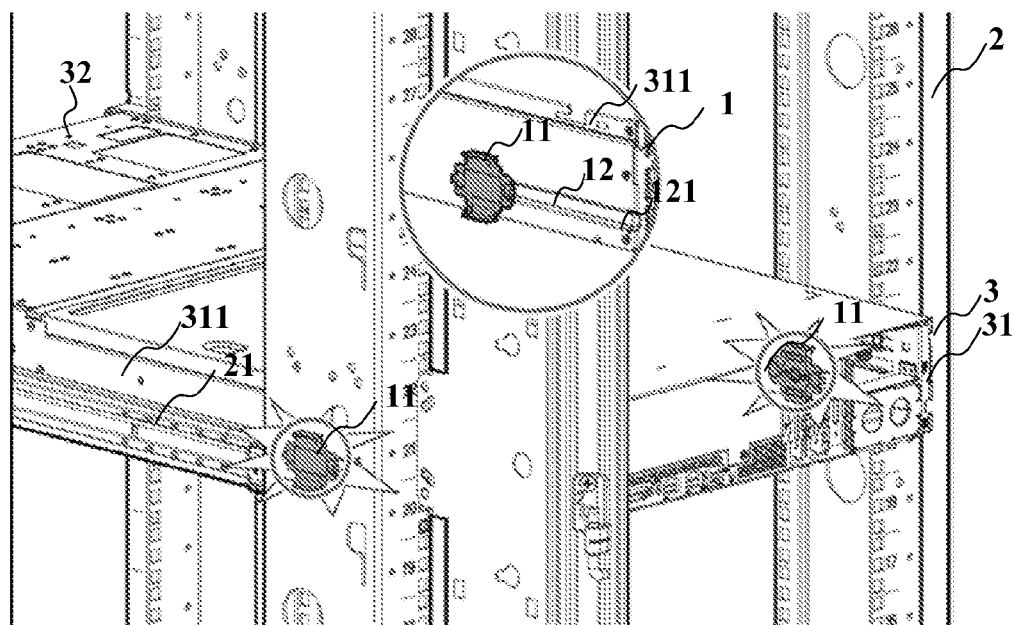
FIG. 4 illustrates a schematic application view of a server system of the present invention in one specific embodiment.

Specifically, please refer to FIGS. 1-4, wherein FIG. 1 illustrates a side view of a limiting piece of the present invention in one specific embodiment; FIG. 2 illustrates a schematic application view of a limiting piece of the present invention in one specific embodiment; FIG. 3 illustrates a side view of a server case of the present invention in one specific embodiment; and FIG. 4 illustrates a schematic application view of a server system of the present invention in one specific embodiment.

The limiting mechanism 1 is applied to a server system, wherein the server system has a server rack 2 and a server 3 as shown in FIG. 4, the server 3 has a server case 31, the server rack 2 comprises sliding rails 21, the sliding rails 21 are oppositely arranged on two sides of the server rack 2 and the server case 31 is slidably arranged on the sliding rails 21, and the mechanism 1 comprises limiting pieces 11, sliding grooves 12 and limiting holes 13.

The limiting piece 11 slidably sets on the sliding rails 21, specifically as shown in FIG. 2, the sliding rail 21 in FIG. 2 is a portion of the sliding rails 21 of the server rack 2 in the server system, the limiting piece 11 is equipped with a convex part 111 on a side surface of the limiting piece towards the server case 31 and specifically is equipped with a first barrier portion 112 on a side of the limiting piece towards a rear end of the sliding rail 21 to limit the limiting piece 11 sliding out of the sliding rail 21.

Referring to FIG. 3, the sliding groove 12 is formed in outer side wall 311 of the server case 31 and are located at rear end of the outer side wall 311 of the server case 31, one end of the sliding groove 12 connected to the rear end surfaces of the outer side wall 311 of the server case for sliding the convex part 111 to slide into the sliding groove 12. The limiting hole 13 is formed in the outer side walls 311 of the server case 31 and is located at the other ends of the sliding grooves 12, and the shape of the limiting holes 13 matches with the shape of the convex part 111, the convex part is to be buckled the limiting holes.

When the server case 31 is mounted on the server rack 2 along the sliding rails 21, the limiting pieces 11 are driven to relatively slide on the sliding rails 21, and the convex part 111 slide along the sliding grooves 12 and is buckled in the limiting holes 13 to limit the movement of the server case 31 in the vertical direction.

In one specific embodiment of the present invention, each limiting piece 11 further comprises a limiting part 113 and two elastic clamping hooks 114 fixed on the limiting part 113, and the two elastic clamping hooks 114 are arranged on upper and lower sides of the limiting part 113 to allow the limiting piece 11 to slidably set on the sliding rail 21 through the two elastic clamping hooks 114.

In one specific embodiment of the present invention, upper and lower sides of the limiting piece 11 are further equipped with two supporting portions 115 respectively corresponding to the two elastic clamping hooks 114, and preferably the two supporting portions 115 are integrally connected with the limiting part 113. When the limiting piece 11 slidably sets on the sliding rail 21, the two supporting portions 115 are clamped on the sliding rail 21 to limit the limiting part from moving up and down relative to the sliding rail 12, so as to prevent the rear end of the server 3 from turning up or the server 3 from falling down when the internal components of the server 3 are drawn out and the drawn-out components are subjected to a downward pressing force, and to guarantee the safety of the system.

In one specific embodiment of the present invention, the two supporting portions 115 are respectively located on inner sides of the two elastic clamping hooks 114, and the elastic clamping hooks 113 are buckling in the sliding rail 12 through the two supporting portions 115 and thereby are buckled. This design can effectively facilitate the limiting piece 11 to be fixed on the rack 2 and facilitate the mounting. In other embodiments, the two supporting portions 115 can also be respectively located on the outer sides of the two elastic clamping hooks 114. Further, the two elastic clamping hooks 114 are connected with the limiting part through a connecting portion 116. In addition, preferably, the connecting portion 116 and the limiting part 113 are respectively equipped with fixing holes to connect each other through rivets.

In one specific embodiment of the present invention, each convex part 111 is a rivet part riveted to the corresponding hole of the limiting piece 11, the rivet part comprises a rivet cap and a rivet head, the rivet cap penetrates through the corresponding fixing hole 117 of the limiting piece 11 to connect the limiting part 113 and the rivet head is exposed out of one side of the limiting piece 11 towards the server case 31 to fit with the sliding groove 12 formed in the outer side wall 311 of the server case 31.

In one specific embodiment of the present invention, the diameter of the rivet head is smaller than the width of the sliding groove 12 and is not greater than the diameter of the limiting hole 13, such that the convex part 111 slides from the notch of one end of the sliding groove 12 to the other end of the sliding groove 12 and is buckled in the limiting hole 13 through the rivet head to limit the movement of the server case 31 in the vertical direction.

In one specific embodiment of the present invention, the server 3 further comprises a first hard disk component (not shown) and a second hard disk component 32 as shown in FIG. 4 (the first hard disk component and the second hard disk component 32 are the internal components of the server 3, and of course, it can be understood that, in other embodiments, the internal components of the server 3 can also be other functional components). In addition, FIG. 4 respectively illustrates the limiting piece 11 covered by the components and the cooperative arrangement of the limiting piece 11 and the server case 31 by using circles to facilitate understanding. The first hard disk component is slidably connected with the inner wall of the server case 31 through a first sliding rail component (not shown); the second hard disk component 32 is slidably connected with the first hard disk component through a second sliding component, the second hard disk component 32 and the first hard disk component are located in parallel in the server case 32, and the second hard disk component 32 is located at an outlet of the server case 3; and the shape of the limiting holes 13 matches with the shape of the convex parts 111 to allow the convex parts 111 to be clamped in the limiting holes 13 when the first hard disk component and the second hard disk component 32 slide out of the server case 31.

To sum up, in the server system and the limiting mechanism used thereby provided by the present invention, through mutual cooperation between the limiting mechanism which sets on the server rack and the sliding grooves and the limiting holes which are formed in outer side walls of the server case, when internal components of the server case 31 are drawn out, the rear end of the server case 31 can be effectively prevented from turning up or falling down, the problem of case fixation when the server rack uses a tray type sliding rail 21 is solved, the structure is simple and reliable and the practicability is very high.

The above-mentioned embodiments are just used for exemplarily describing the principle and effects of the present invention instead of limiting the present invention. One skilled in the art can make modifications or changes to the above-mentioned embodiments without going against the spirit and the range of the present invention. Therefore, all equivalent modifications or changes made by those who have common knowledge in the art without departing from the spirit and technical concept disclosed by the present invention shall be still covered by the claims of the present invention.

What is claimed is:

1. A limiting mechanism, applied to a server system, the server system having a server rack and a server case, the server rack comprising sliding rails, the sliding rails being oppositely arranged on two sides of the server rack, and the server case being slidably arranged on the sliding rails, and wherein the mechanism comprises:
    limiting piece, slidably sitting on the sliding rails, equipped with a convex part on a side surface of the limiting piece towards the server case, equipped with a first barrier portion on a side of the limiting piece towards a rear end of the sliding rail to limit the limiting piece sliding out of the sliding rail;
    sliding groove, formed in outer side wall of the server case and located at rear end of the outer side wall of the server case, one end of the sliding groove connecting to the rear end surfaces of the outer side wall of the server case for sliding the convex part into the sliding groove; and
    limiting hole, formed in the outer side walls of the server case and located at another end of the sliding grooves, the shape of the limiting holes matching with the shape of the convex part, the convex part to be buckled the limiting holes;
    wherein when the server case is mounted on the server rack along the sliding rails, the limiting pieces are driven to relatively slide on the sliding rails, and the convex part slides along the sliding grooves and is buckled in the limiting holes to limit the vertical movement of the server case.

2. The limiting mechanism according to claim 1, wherein the limiting piece further comprises a limiting part and two elastic clamping hooks fixed on the limiting part, and the two elastic clamping hooks are arranged on upper and lower sides of the limiting part, the limiting piece is slidably set on the sliding rail through the two elastic clamping hooks.

3. The limiting mechanism according to claim 2, wherein upper and lower sides of the limiting piece are equipped with two supporting portions respectively corresponding to the two elastic clamping hooks, the two supporting portions are integrally connected with the limiting part, and when the limiting piece slidably sets on the sliding rail, the two supporting portions are clamped on the sliding rail to limit the vertical movement of the limiting part.

4. The limiting mechanism according to claim 3, wherein the two supporting portions are respectively located on inner sides of the two elastic clamping hooks, and when the limiting piece slidably sets on the sliding rail, the elastic clamping hooks are in buckling connection with the sliding rail.

5. The limiting mechanism according to claim 2, wherein the two elastic clamping hooks are connected with the limiting part through a connecting portion.

6. The limiting mechanism according to claim 5, wherein the connecting portion and the limiting part are respectively equipped with fixing holes to connect each other through rivets.

7. The limiting mechanism according to claim 1, wherein the convex part is a rivet part riveted to the limiting piece, the rivet part comprises a rivet cap and a rivet head, the rivet cap penetrates through the limiting part to connect the limiting part, and the rivet head is exposed out of one side of the limiting piece towards the server case.

8. The limiting mechanism according to claim 7, wherein the diameter of the rivet head is smaller than the width of the sliding groove and is not greater than the diameter of the limiting hole, such that when the convex part slides from the notch of one end of the sliding groove to the other end of the sliding groove, the convex part is buckled in the limiting hole through the rivet head.

9. A server system, wherein the server system comprises a server, a server rack equipped with sliding rails and a limiting device, the server is mounted on the server rack through the sliding rails, and the server comprises:
    a server case;
    a first hard disk component, slidably connected with an inner wall of the server case through a first sliding rail component;
    a second hard disk component, slidably connected with the first hard disk component through a second sliding component, the second hard disk component and the first hard disk component being located in parallel in the server case, and the second hard disk component being located at an outlet of the server case; and the limiting device comprises:
    limiting piece, slidably setting on the sliding rails, equipped with a convex part on the side surface of the limiting piece towards the server case, and equipped with a first barrier portion on the side of the limiting piece towards a rear end portion of the sliding rail to limit the limiting piece from sliding out of the sliding rail;
    sliding grooves, formed in outer side walls of the server case and located at rear ends of the outer side walls of the server case, one end of the sliding groove connecting to the rear end surfaces of the outer side wall of the server case for sliding the convex part into the sliding groove; and
    limiting holes, formed in the outer side walls of the server case and located at another end of the sliding grooves, the shape of the limiting holes matching with the shape of the convex parts to allow the convex parts to be clamped in the limiting holes.

10. The server system according to claim 9, wherein each limiting piece further comprises a limiting part and two elastic clamping hooks fixed on the limiting part, the two elastic clamping hooks are arranged on upper and lower sides of the limiting part, and the limiting piece is slidably set the sliding rail through the two elastic clamping hooks.

* * * * *